United States Patent [19]

Corman

[11] Patent Number: 5,630,225
[45] Date of Patent: May 13, 1997

[54] DIELECTRIC RESONATOR IMAGE REJECT MIXER AND METHOD

[75] Inventor: David W. Corman, Chandler, Ariz.

[73] Assignee: Motorola, Inc., Schaumburg, Ill.

[21] Appl. No.: 644,733

[22] Filed: May 10, 1996

Related U.S. Application Data

[63] Continuation of Ser. No. 320,850, Oct. 7, 1994, abandoned, which is a continuation of Ser. No. 930,949, Aug. 17, 1992, abandoned.

[51] Int. Cl.$^6$ .................................................. H04B 1/10
[52] U.S. Cl. .................... 455/302; 455/307; 455/317; 455/327
[58] Field of Search ................................. 455/285, 286, 455/287, 302, 307, 317, 323, 327; 333/204, 205, 219.1

[56] References Cited

U.S. PATENT DOCUMENTS

| | | | |
|---|---|---|---|
| 3,300,729 | 1/1967 | Chang | 330/4.9 |
| 4,126,828 | 11/1978 | Kumagai | 455/207 |
| 4,225,974 | 9/1980 | Miyamoto | 455/207 |
| 4,236,252 | 11/1980 | Kominami et al. | 455/207 |
| 4,461,040 | 7/1984 | Dobrovolny | 455/327 |
| 4,541,123 | 9/1985 | Saka | 455/325 |
| 4,601,062 | 7/1986 | Hettiger | 455/302 X |
| 4,737,737 | 4/1988 | Khanna | 331/47 |
| 5,060,297 | 10/1991 | Ma et al. | 455/307 X |
| 5,223,807 | 6/1993 | Konishi et al. | 455/307 |

OTHER PUBLICATIONS

An article entitled "A Dielectric Resonator Bandstop Filter" by P. Guillon et al., IEEE, Copyright 1981, pp. 170–173.

An article entitled "Dielectric Resonators Band Pass Filter with High Attenuation Rate" by P. Guillon et al., 1984 IEEE MTT-S Digest, Copyright 1984, pp. 240–242.

Primary Examiner—Edward F. Urban
Attorney, Agent, or Firm—Jeffrey D. Nehr; Bradley J. Botsch, Sr.

[57] ABSTRACT

A dielectric resonator image reject mixer and method comprises an amplifier for amplifying a receive frequency (RF) signal and outputting a first combined signal comprising a RF signal, a RF noise signal, and an image noise signal. A dielectric resonator image rejector is coupled to the amplifier. The dielectric resonator image rejector receives the first combined signal but outputs only a second combined signal comprising the RF signal and the RF noise signal to a mixer coupled to the dielectric resonator image rejector. The image noise signal is rejected by either reflection or resonant transmission to a resistor-terminated microstrip line. A mixer mixes the combined RF signal and the RF noise signal from the dielectric resonator image rejector with a local oscillation frequency signal, producing an intermediate frequency output signal.

10 Claims, 1 Drawing Sheet

DIELECTRIC RESONATOR IMAGE REJECT MIXER AND METHOD

This application is a continuation of prior application Ser. No. 08/320,850, filed Oct. 7, 1994, now abandoned, which is a continuation of application Ser. No. 07/930,949, Aug. 17, 1992, now abandoned.

BACKGROUND OF THE INVENTION

This invention relates in general to the field of suppression of image noise in communications, and in particular to suppression of image noise during frequency downconversion in superheterodyne communications receivers.

A well-known occurrence in superheterodyne receivers is that the front end low-noise amplifier in such systems will generate thermal noise at the image frequency and that during the downconversion process the image noise will "fold over" onto the thermal noise at the desired receiver frequency. To avoid the associated degradation in system sensitivity, 15–20 decibels (dB) of image noise rejection is required prior to downconversion.

There are two general methods for providing such image rejection in communications receivers. The first uses a bandpass filter (image filter) centered at the desired receive frequency and connected between a low noise amplifier and a downconversion mixer. The bandpass filter is designed to provide 15–20 dB of noise suppression at the image frequency while passing the desired receive frequency (RF). For receiver applications where the intermediate frequency (IF) is very low relative to the RF frequency, the required Q of the image filter can be very high since the percentage difference between the RF and the image frequencies is very small (i.e., the local oscillator (LO) frequency is very close to the RF). High Q filters are typically realized using air dielectric cavity filter configurations. Major drawbacks to this method are that cavity filters are physically large, must be aligned prior to installation into a module, and require input/output transitions between the cavity transmission medium (coaxial, waveguide, etc.) and the planar transmission medium (typically microstrip).

The second method for providing image rejection incorporates a conventional image reject mixer whose topology is designed to downconvert the LO frequency plus the IF and the LO frequency minus the IF sidebands into separate IF output ports. However, considerable mixer complexity and development risk results from this method, especially at the higher microwave frequencies. The mixers must be well matched and the phase relationships well maintained in order to achieve adequate image suppression. In addition, the required local oscillator power for this method is 3 dB higher than that required for a comparable non-image rejection mixer.

Thus, what is needed is a relatively simple, efficient, and easily maintained method and apparatus for image suppression in communications receivers which is implementable with any standard mixer and which is smaller than conventional cavity filters and does not require filter input/output transitions. It would be additionally desirable if such a method and apparatus would provide selectable bandwidth capability.

SUMMARY OF THE INVENTION

Accordingly, it is an advantage of the present invention to provide a new and improved method and apparatus for image rejection in communications receivers. It is a further advantage of the present invention to provide a new dielectric resonator image reject mixer and method.

To achieve the above advantages, a dielectric resonator image reject mixer is contemplated, comprising an amplifier for amplifying a RF signal and outputting a first combined signal comprising a RF signal, a RF noise signal, and an image noise signal, a dielectric resonator image rejector coupled to the amplifier, the dielectric resonator image rejector for receiving the first combined signal and outputting a second combined signal comprising the RF signal and the RF noise signal, and a mixer coupled to the dielectric resonator image rejector, the mixer for mixing the second combined signal with a local oscillation frequency signal, producing an intermediate frequency output signal.

To further achieve the above advantages, a method of image noise signal rejection using a dielectric resonator image reject mixer is contemplated, the method comprising the steps of receiving a RF input into a low noise amplifier, outputting a first combined signal comprising a RF signal, a RF noise signal, and an image noise signal from the low noise amplifier, processing the first combined signal in a dielectric resonator, outputting a second combined signal comprising the RF signal and the RF noise signal from the dielectric resonator, rejecting the image noise signal from the dielectric resonator, providing a local oscillation frequency signal from a local oscillator, and mixing the second combined signal with the local oscillation frequency signal, producing an intermediate frequency output signal.

The above and other features and advantages of the present invention will be better understood from the following detailed description taken in conjunction with the accompanying drawings.

DETAILED DESCRIPTION OF THE PREFERRED EMBODIMENT

Figure 1:
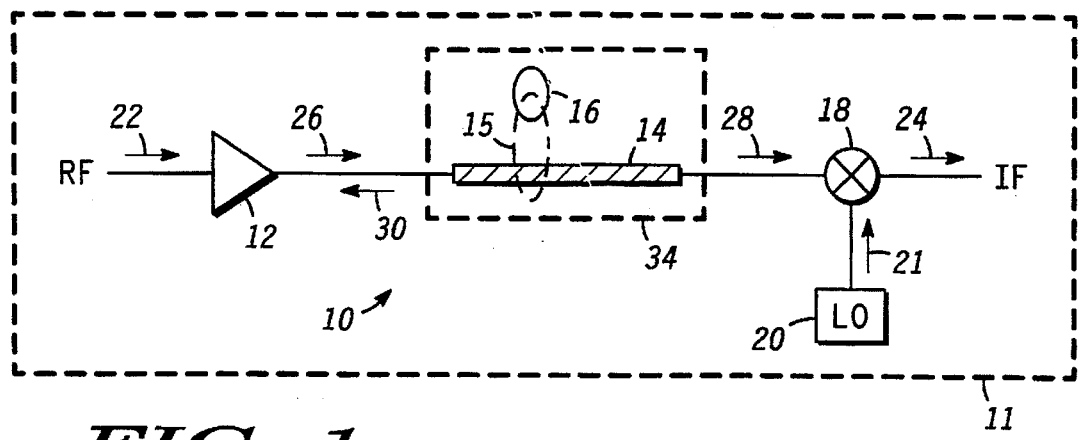
In FIG. 1, there is shown a diagram of a dielectric resonator image reject mixer in accordance with a preferred embodiment of the invention.

The diagram in FIG. 1 illustrates a dielectric resonator image reject mixer 10 in accordance with a preferred embodiment of the invention. Such a dielectric resonator image reject mixer is suitable for use in a communications receiver 11, which can be a superheterodyne communications receiver. The major components comprise amplifier 12, microstrip line 14, dielectric resonator 16, mixer 18, and local oscillator 20. Amplifier 12 is coupled to a first end of microstrip line 14. Amplifier 12 is preferably a low noise amplifier. RF signal 22 is the input to amplifier 12.

Dielectric resonator 16 is positioned in close proximity to the microstrip line 14. When microstrip line 14 carries a first combined signal, signal 26, which comprises a RF signal portion, a RF noise signal portion, and an image noise portion, magnetic field 15 is generated. Magnetic field 15 interacts with dielectric resonator 16, causing dielectric resonator 16 to reject image noise signal 30. The rejected image noise signal 30 is sent back or reflected toward amplifier 12. Microstrip line 14 continues to carry a second combined signal, signal 28, which is signal 26 less the image noise signal 30, to mixer 18.

Mixer 18 is coupled to the second end of microstrip line 14 to receive signal 28 and to LO 20 to receive LO signal 21. Mixer 18 combines LO signal 21 from LO 20 and signal 28 from microstrip line 14 to produce IF signal 24. IF signal 24 is the output for the dielectric resonator image reject mixer 10.

In FIG. 1, the combination of the dielectric resonator 16 and the microstrip line 14 in close proximity to the dielectric resonator 16 comprise image reject resonator 34. It is the image reject resonator 34 which provides image noise signal 30 rejection.

Figure 2:
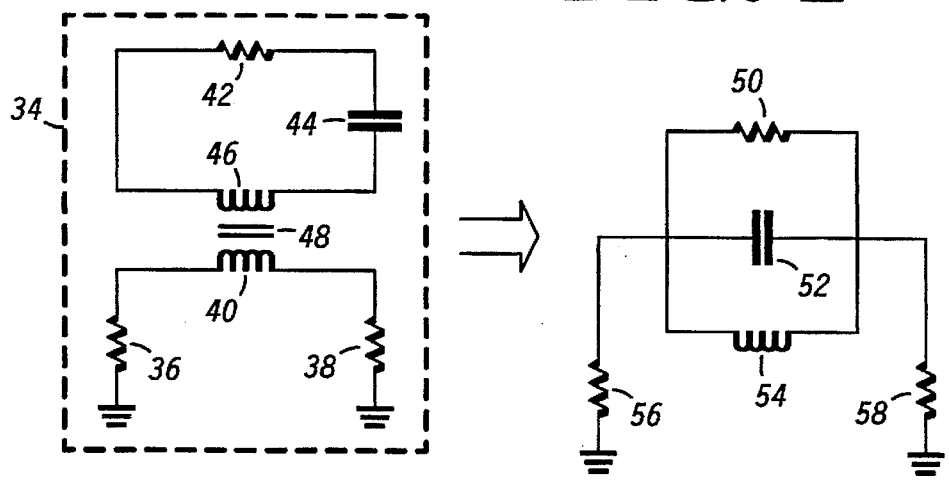
In FIG. 2, there is shown a diagram of an equivalent circuit of the dielectric resonator and microstrip line combination shown in FIG. 1.

The left-hand side of FIG. 2 illustrates a circuit schematic equivalent to image reject resonator 34 in FIG. 1. Image reject resonator 34 comprises a dielectric resonator portion and a microstrip line portion. The dielectric resonator portion of image reject resonator 34 comprises a series connection of dielectric resonator capacitor 44 of capacitance $C_r$, dielectric resonator resistor 42 of resistance $R_r$, and dielectric resonator inductor 46 of inductance $L_r$. The microstrip line portion of image reject resonator 34 comprises a series connection of microstrip line inductor 40 of inductance $L_l$ between microstrip line impedances 36 and 38, each of impedance value $Z_o$ (e.g., 50 ohms), with the series connection of microstrip line inductor 40 and microstrip line impedances 36 and 38 coupled to electrical ground at both ends of the series connection. Mutual inductance 48 of value $L_m$ exists between dielectric resonator inductor 46 and microstrip line inductor 40. Inductance $L_l$ can be approximated as zero since it is much smaller than $L_m$.

Using analysis such as that described by P. Guillon and S. Mekerta, "A Bandstop Dielectric Resonator Filter," IEEE Microwave Symposium, Los Angeles, 1981 and D. Kajfez, "Short Course on Dielectric Resonators," University of Mississippi, near the resonant frequency of the dielectric resonator 16 in FIG. 1, the left-hand side of FIG. 2 may be simplified to the circuit shown at the right-hand side of FIG. 2. The equivalent circuit comprises in part a parallel connection of equivalent circuit resistor 50 of resistance R, equivalent circuit capacitor 52 of capacitance C, and equivalent circuit inductor 54 of inductance L. The parallel connection of resistor 50, capacitor 52, and inductor 54 is itself connected in series between equivalent circuit impedances 56 and 58, each of impedance value $Z_o$. Equivalent circuit impedances 56 and 58 are each additionally coupled to electrical ground.

Varying the distance between the dielectric resonator 16 and the micros trip line 14 in FIG. 1 varies the Q of the equivalent loaded resonator circuit in the right-hand portion of FIG. 2. At the resonant image frequency, the impedance seen in FIG. 1 while looking into the microstrip line 14 is very high (on the order of kilo-ohms) and thus energy at the resonant frequency is reflected away from the mixer 18 input.

The equivalent circuit parameters discussed above can be related to physically measured parameters as follows:

$$Q_o = \frac{2\pi f_o L_r}{R_r} \quad \text{(Equation 1)}$$

$$Q_L = \frac{Q_o}{1+\beta} \quad \text{(Equation 2)}$$

$$R = 2\pi\beta Z_o \quad \text{(Equation 3)}$$

$$A = 20 \log_{10}\left(\frac{2}{2+\frac{R}{Z_o}}\right) \quad \text{(Equation 4)}$$

where $$\beta = \frac{L_m^2}{L_r C_r R_r (2Z_o)} \quad \text{(Equation 5)}$$

$$f_o = \frac{1}{2\pi\sqrt{L_r C_r}} \quad \text{(Equation 6)}$$

and where $Q_o$ is the unloaded Q of the circuit, $Q_L$ is the loaded Q of the circuit, A is the attenuation, β is a coupling coefficient, and $f_o$ is the center frequency.

As an example, assume a loaded Q of 200 is required (0.5% bandwidth) using a resonator with an unloaded Q of 5,000. Using Equation 2, the corresponding beta coupling coefficient is thus (5000/200)−1, or 24. The equivalent series resistance using equation 3 is (2)(24)(50), or 2400 ohms. The attenuation at the image frequency using equation 4 is $(20)\log_{10}(2/(2+2400/50))$, or −27 dB. This equates to a degradation in system noise of less than 0.01 dB.

A computer simulation of the dielectric resonator image reject mixer 10 in FIG. 1 was performed, simulating a dielectric resonator image reject mixer 10 which downconverts a 19.95 GHz RF signal 22 to a 0.775 GHz IF signal 24. The dielectric resonator image reject mixer 10 simulation provided rejection at the image frequency of 18.45 GHz, which is twice the IF signal 24 frequency below the RF signal 22 frequency. The difference in conversion loss between the RF and image responses for a standard mixer configuration was negligible, while the image rejection using the dielectric resonator image reject mixer 10 was 23 dB.

Figure 3:
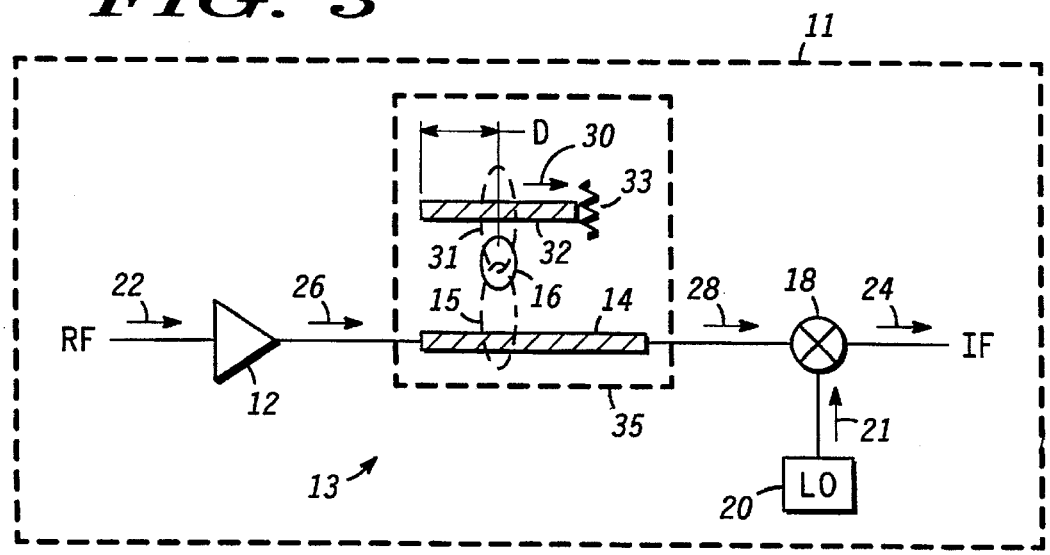
In FIG. 3, there is shown a diagram of a dielectric resonator image reject mixer with image termination in accordance with another preferred embodiment of the invention.

FIG. 3 illustrates a diagram of a dielectric resonator image reject mixer 13 with image termination in accordance with another preferred embodiment of the invention. Dielectric resonator image reject mixer 13 is suitable for use in a communications receiver 11, which can be a superheterodyne communications receiver. Such a dielectric resonator image reject mixer 13 in FIG. 3 is identical with dielectric resonator image reject mixer 10 in FIG. 1 in both structure and function, with the exception of the image reject resonator 35, which replaces the image reject resonator 34 of FIG. 1.

The image reject resonator 35 in FIG. 3 comprises a microstrip line 14 and a microstrip line 32 which is adjacent to and preferably placed parallel to microstrip line 14. The microstrip line 32 comprises a first end and a second end terminated by termination resistor 33. In FIG. 3, dielectric resonator 16 is positioned between and in close proximity to both the microstrip line 14 and the microstrip line 32. The preferred location of dielectric resonator 16 relative to microstrip line 32 is to center the dielectric resonator 16 a distance of one-fourth the wavelength (or any odd multiple thereof) of the image noise signal 30 along the first end of micros trip line 32. The one-quarter wavelength is indicated as "D" in FIG. 3.

As in the case of FIG. 1, the microstrip line 14 in FIG. 3 receives signal 26 from amplifier 12 and out-puts signal 28 to mixer 18. Also, as in the case of FIG. 1, when microstrip line 14 in FIG. 3 carries signal 26, magnetic field 15 is generated which interacts with dielectric resonator 16. However, in the FIG. 3 embodiment, the rejected image noise signal 30 is resonantly transmitted via magnetic field 31 to microstrip line 32. The reject image noise signal 30 is then dissipated through termination resistor 33. In FIG. 3, as in FIG. 1, signal 28 is conducted through microstrip line 14 to mixer 18.

Thus, a dielectric resonator image reject mixer and method has been described which overcomes specific problems and accomplishes certain advantages relative to prior art methods and mechanisms. The improvements over known technology are significant. First, the dielectric resonator image reject mixer can be implemented with any standard mixer. Second, the considerable complexity of a conventional image rejection mixer is avoided, which is particularly important at higher microwave frequencies. Third, the required local oscillator power is 3 dB lower than that required by conventional image rejection mixer topology. Fourth, the relative dielectric constant of the dielectric resonator material is much higher than that of air, so the size and weight is much smaller than cavity filters. Fifth, only the image frequency couples to the resonator, so the receive frequency "sees" only a single 50 ohm line and does not have to pass through filter input/output transitions. Sixth, the loaded Q of the resonator can be modulated by changing the magnetic coupling between the resonator and the microstrip line, thereby allowing the rejection bandwidth to be set to suit the application.

Thus, there has also been provided, in accordance with several embodiments of the invention, a dielectric resonator image reject mixer and method that fully satisfies the aims and advantages set forth above. While the invention has been described in conjunction with several specific embodiments, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

What is claimed is:

1. A dielectric resonator image reject mixer comprising:
   a low noise amplifier for receiving a receive frequency (RF) signal input and outputting a first combined signal comprising a RF signal, a RF noise signal, and an image noise signal;
   a local oscillator for producing a local oscillation frequency signal;
   a mixer coupled to the local oscillator;
   a microstrip line coupled between the low noise amplifier and the mixer, the microstrip line to receive the first combined signal; and
   a dielectric resonator coupled in close proximity to the microstrip line such that a magnetic field is generated when the first combined signal is passed through the microstrip line, said magnetic field interacting with the dielectric resonator such that an image noise signal is rejected from the microstrip line to the low noise amplifier and a second combined signal comprising the RF signal and the RF noise signal is conducted through the microstrip line to the mixer, the mixer mixes the second combined signal with the local oscillation frequency signal to produce an intermediate frequency output signal.

2. A dielectric resonator image reject mixer as claimed in claim 1, further comprising: a second microstrip line adjacent to the microstrip line.

3. A dielectric resonator image reject mixer as claimed in claim 2, wherein the second microstrip line is positioned parallel to the microstrip line.

4. A dielectric resonator image reject mixer as claimed in claim 3, wherein the second microstrip line comprises:
   a first end; and
   a second end terminated with a resistor.

5. A dielectric resonator image reject mixer as claimed in claim 4, wherein the center of the dielectric resonator is positioned a distance of an odd multiple of one-quarter wavelength of the image noise signal along the first end of the second microstrip line.

6. A dielectric resonator image reject mixer comprising:
   amplification means for amplifying a receive frequency (RF) signal and outputting a first combined signal comprising a RF signal, a RF noise signal, and an image noise signal;
   a microstrip line coupled to the amplification means, the microstrip line to receive the first combined signal;
   a dielectric resonator coupled in close proximity to the microstrip line such that a magnetic field is generated when the first combined signal is passed through the microstrip line, the magnetic field interacting with the dielectric resonator such that the image noise signal is reflected from the microstrip line to the amplification means .and a second combined signal comprising the RF signal and the RF noise signal is conducted through the microstrip line;
   mixer means coupled to the microstrip line, the mixer means for mixing the second combined signal with a local oscillation frequency signal, producing an intermediate frequency output signal.

7. A dielectric resonator image reject mixer as claimed in claim 6, further comprising a second microstrip line adjacent to the microstrip line.

8. A dielectric resonator image reject mixer as claimed in claim 7, wherein the second microstrip line is positioned parallel to the microstrip line.

9. A dielectric resonator image reject mixer as claimed in claim 8, wherein the second microstrip line comprises:
   a first end; and
   a second end terminated with a resistor.

10. A dielectric resonator image reject mixer as claimed in claim 9, wherein the center of the dielectric resonator is positioned a distance of an odd multiple of one-quarter wavelength of the image noise signal along the first end of the second microstrip line.

\* \* \* \* \*